United States Patent
Huang et al.

(10) Patent No.: US 7,928,868 B1
(45) Date of Patent: Apr. 19, 2011

(54) ENTROPY DECODING DEVICE

(75) Inventors: Sheng-Che Huang, Taipei Hsien (TW); Yi-Shin Li, Taipei Hsien (TW); Hsieh-Fu Tsai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/632,917

(22) Filed: Dec. 8, 2009

(30) Foreign Application Priority Data

Oct. 29, 2009 (CN) .......................... 2009 1 0309029

(51) Int. Cl.
*H03M 7/00* (2006.01)

(52) U.S. Cl. .......................................... 341/107; 341/51

(58) Field of Classification Search .................. 341/107, 341/106, 51, 67, 65; 375/240.25; 382/247; 704/500
See application file for complete search history.

(56) References Cited

U.S. PATENT DOCUMENTS

| 7,808,406 B2 * | 10/2010 | He et al. .......................... 341/107 |
| 2006/0022848 A1 | 2/2006 | Nomura |

* cited by examiner

*Primary Examiner* — Joseph Lauture
(74) *Attorney, Agent, or Firm* — Raymond J. Chew

(57) ABSTRACT

An entropy decoding device offers all nodes on a decoding tree, and a most probable symbol for each node, and predicts presumptive information of a next node. The entropy decoding device decodes an encoded bit stream, and output a decoded content that includes real information of the next node. The entropy decoding device further generates a flush instruction to the table look-up module, when the prediction misses, and updates the most probable symbol.

9 Claims, 4 Drawing Sheets

ENTROPY DECODING DEVICE

BACKGROUND

1. Technical Field

Embodiments of the present disclosure relate to decoding devices, and especially to an entropy decoding device.

2. Description of Related Art

Context-based adaptive binary arithmetic coding (CABAC) is a tool selected by H.264/AVC to compress video data streams. An entropy decoding process of CABAC can be seen as a binary tree traversing. However, throughput of the entropy decoding process is limited, due to complex arithmetic calculations and dependence between binary nodes.

An entropy decoding process is the most important arithmetic calculations. Therefore, the performance and efficiency of H.264/AVC will be improved if the entropy decoding process increases.

DETAILED DESCRIPTION

Figure 1:
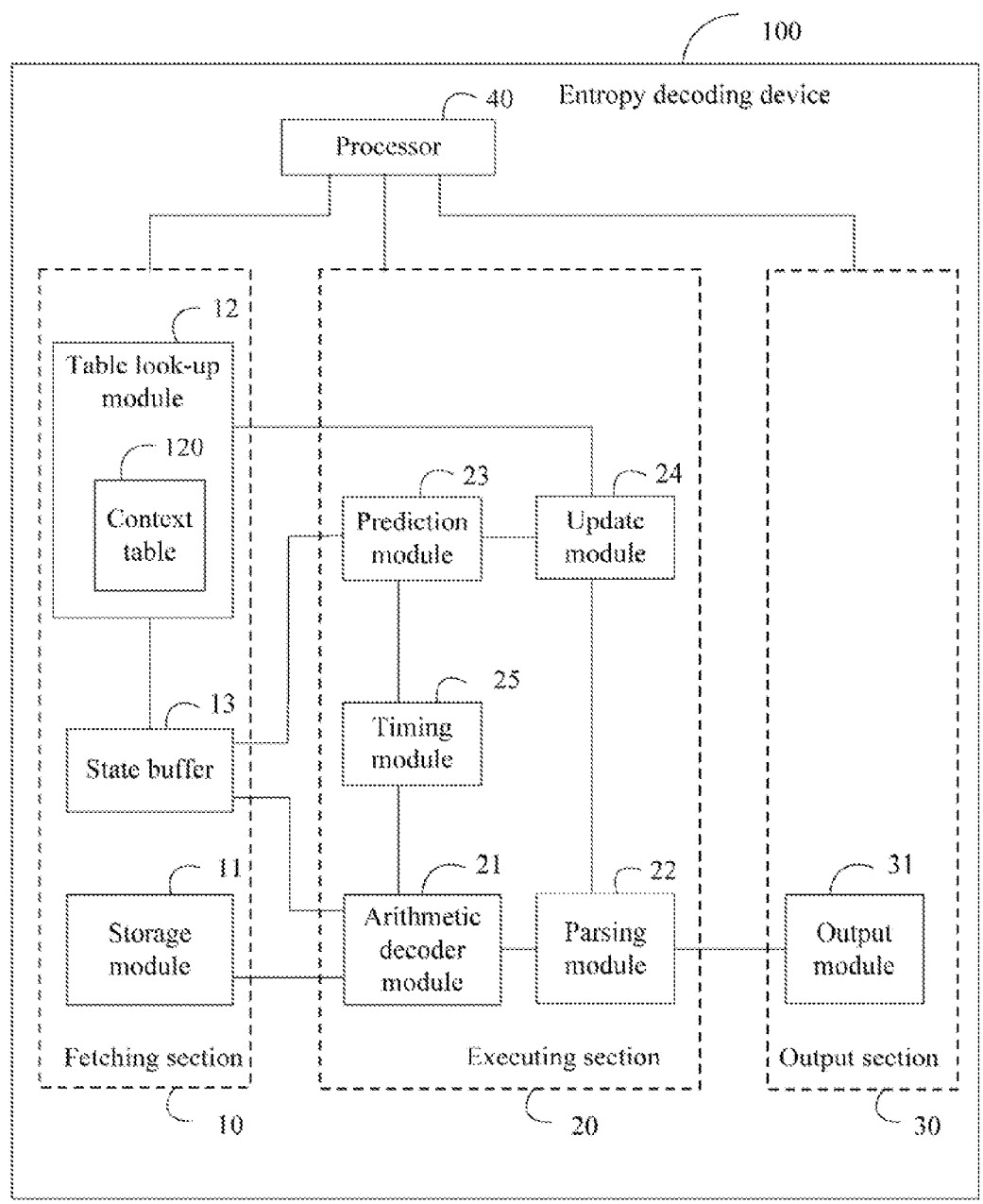
FIG. 1 is a block diagram of one embodiment of an application environment of an entropy decoding device as disclosed.
Figure 2:
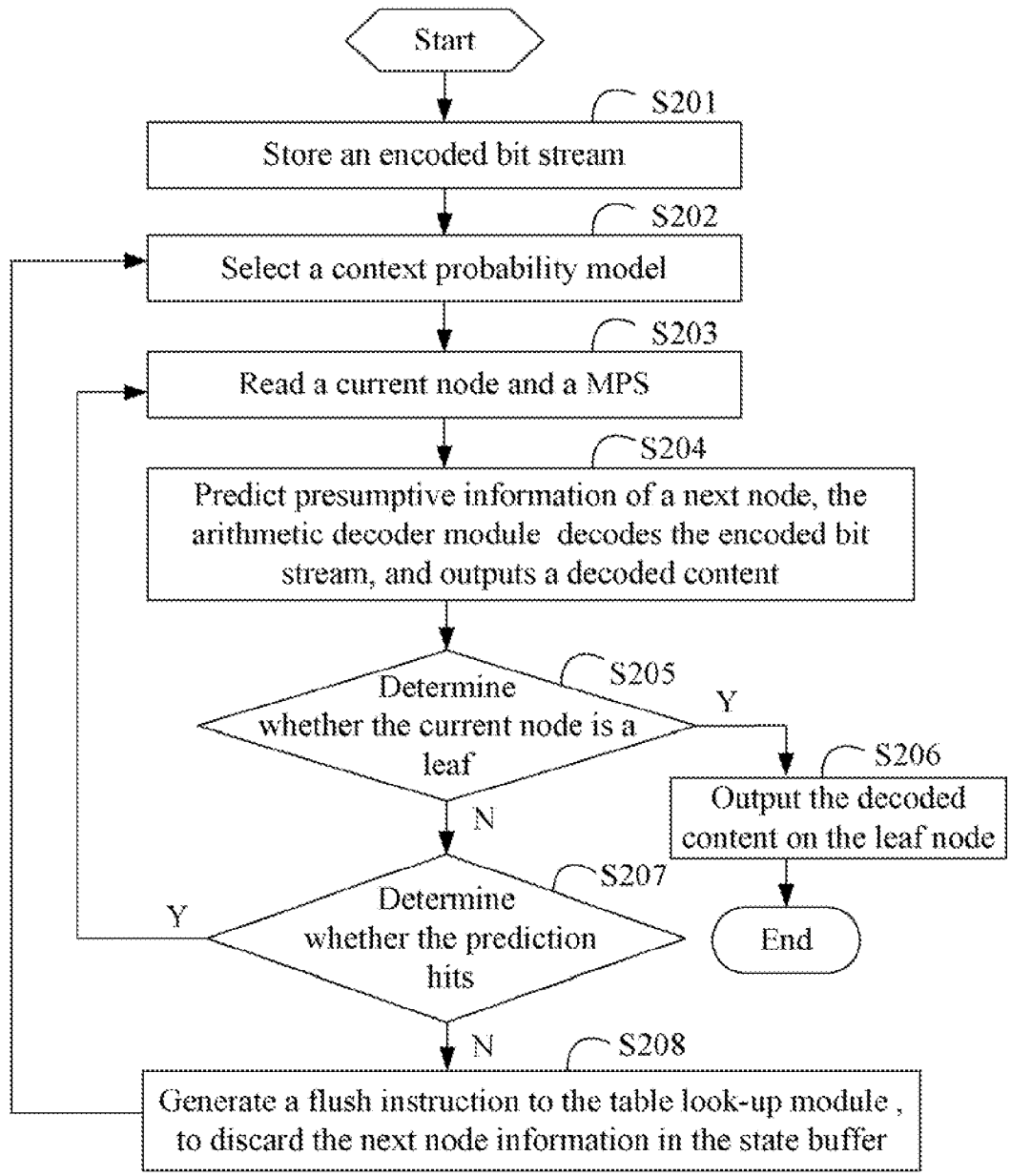
FIG. 2 is a flowchart of one embodiment of an entropy decoding process as disclosed.

Referring to FIG. 1, a block diagram of one embodiment of an application environment of an entropy decoding device 100 is disclosed. In one embodiment, the entropy decoding device 100 may be a set-top box with an entropy decoding function.

In one embodiment, the entropy decoding device 100 decodes context-based adaptive binary arithmetic code (CABAC) bit streams, according to the H.264/AVC standard. The H.264/AVC defines a decoding table and a decoding process in detail. Each decoding table represents a decoding tree, and each decoding tree comprises a plurality of branch nodes and leaf nodes. The decoding tree is structured as a binary tree. In other embodiments, the entropy decoding device 100 may decode other kinds of video encoded by other standards, such as context-based adaptive variable length coding (CALVC).

The entropy decoding device 100 comprises a fetching section 10, an executing section 20, and an output section 30. Furthermore, the entropy decoding device 100 comprises a processor 40 to execute at least one computerized instruction for the modules of the sections 10, 20 and 30.

The fetching section 10 comprises a storage module 11, a table look-up module 12, and a state buffer 13.

The storage module 11 is operable to store an encoded bit stream of video data.

The table look-up module 12 is operable to select a context probability model for the encoded bit stream, to offer dependence between nodes on a decoding tree.

In one embodiment, the table look-up module 12 comprises a context table 120. In one embodiment, the context table 120 is operable to store a plurality of context probability models.

Each context probability model comprises a most probable symbol (MPS), a least probable symbol (LPS), and a state corresponding to each of the nodes on the decoding tree. In one embodiment, the MPS value follows the context probability model of the H.264/AVC standard, to indicate the next node is a left child or right child in probability. The MPS value is equal to 0 or 1. MPS=0 means the next node is probably a left child, and MPS=1 means the next node is probably a right child. In one embodiment, different nodes have their own MPS values.

The state buffer 13 is operable to read a current node and the MPS from the table look-up module 12. In one embodiment, the state buffer 13 reads and discards the current node and the MPS in pipeline, which improves flexibility of reading and discarding nodes and the speed of the entropy decoding device 100.

The executing section 20 comprises an arithmetic decoder module 21, a parsing module 22, a prediction module 23, an update module 24, and a timing module 25. In one embodiment, the timing module 25 is operable to offer clock cycles.

The arithmetic decoder module 21 is connected to the state buffer 13 and the storage module 11. The arithmetic decoder module 21 is operable to decode the encoded bit stream according to the current node, and output a decoded content. In one embodiment, the decoded content comprises real information of a next node.

The parsing module 22 is connected to the arithmetic decoder module 21, to determine whether the current node in the arithmetic decoder module 21 is a leaf node or a branch node. In one embodiment, the paring module 22 is further operable to output the decoded content to the output section 30 if the current node is the leaf node, and output the decoded content to the update module 24 if the current node is the branch node.

The prediction module 23 is operable to predict presumptive information of the next node. In one embodiment, the prediction module 23 predicts the next node is a left child node or a right child node, according to the current node and the MPS of the current node from the state buffer 13.

In one embodiment, the arithmetic decoder module 21 and the prediction module 23 operate synchronously.

The update module 24 is connected to the parsing module 22 and the prediction module 23, for determining if the prediction hits or misses. The update module 24 is further operable to generate a flush instruction to the table look-up module 12 if the prediction misses. In one embodiment, it should be understood that a prediction hit means the presumptive information of the next node conforms to the real information of the next node. A prediction miss means the presumptive information of the next node does not conform to the real information of the next node.

In one embodiment, the arithmetic decoder module 21 is further operable to decode the next node in the state buffer 13, if the prediction hits.

In one embodiment, the table look-up module 12 updates the MPS, according to the flush instruction. In one embodiment, a means for updating the MPS comprises maintaining the context probability model, according to a probability state conversion means in the H.264/AVC standard. The context probability model comprises offset and range. The entropy decoding device 10 may change a prediction direction, according to the MPS updating, such as MPS=0 converse to MPS=1.

The state buffer 13 is further to flush the current node, and read the next node according to the real information of the next node in the decoded content, after the table look-up module 12 receives the flush instruction.

The output section 30 comprises an output module 31, to output the decoded content.

A flowchart of one embodiment of an entropy decoding process is shown. Depending on the embodiment, additional blocks may be added, others deleted, and the ordering of the blocks may be changed.

In block S201, the storage module 11 stores an encoded bit stream of video data.

In block S202, the table look-up module 12 selects a context probability model, corresponding to the encoded bit stream. The context probability model comprises a MPS, a LPS, and a state corresponding to each of the nodes on the decoding tree. In one embodiment, the MPS value for leaf nodes is null.

In block S203, the state buffer 13 reads a current node and the MPS from the table look-up module 12. In one embodiment, the state buffer 13 reads and discards the current node and the MPS in pipeline.

In block S204, the prediction module 23 predicts presumptive information of a next node, and the arithmetic decoder module 21 decodes the encoded bit stream and outputs a decoded content. In one embodiment, the decoded content comprises real information of the next node.

In one embodiment, the prediction module 23 and the arithmetic decoder module 21 operate synchronously.

In block S205, the parsing module 22 determines whether the current node in the arithmetic decoder module 21 is a leaf node or a branch node. In one embodiment, the process goes to block S206, if the current node is the leaf node, and goes to block S207, if the current node is the branch node.

In block S206, the parsing module 22 outputs the decoded content to the output module 31. The output module 31 outputs the decoded content on the leaf node.

In block S207, the update module 24 determines whether the prediction hits or misses. In one embodiment, the prediction hit means that the presumptive information of the next node conforms to the real information of the next node. The prediction miss means that the presumptive information of the next node does not conform to the real information of the next node. In one embodiment, it goes to block S203, if the prediction hits, and goes to block S208, if the prediction misses.

In block S203, the current node is updated, according to the prediction.

In block S208, the update module 24 generates a flush instruction to the table look-up module 12, to discard the next node information in the state buffer 13. Then, the process goes back to block S202.

Figure 3:
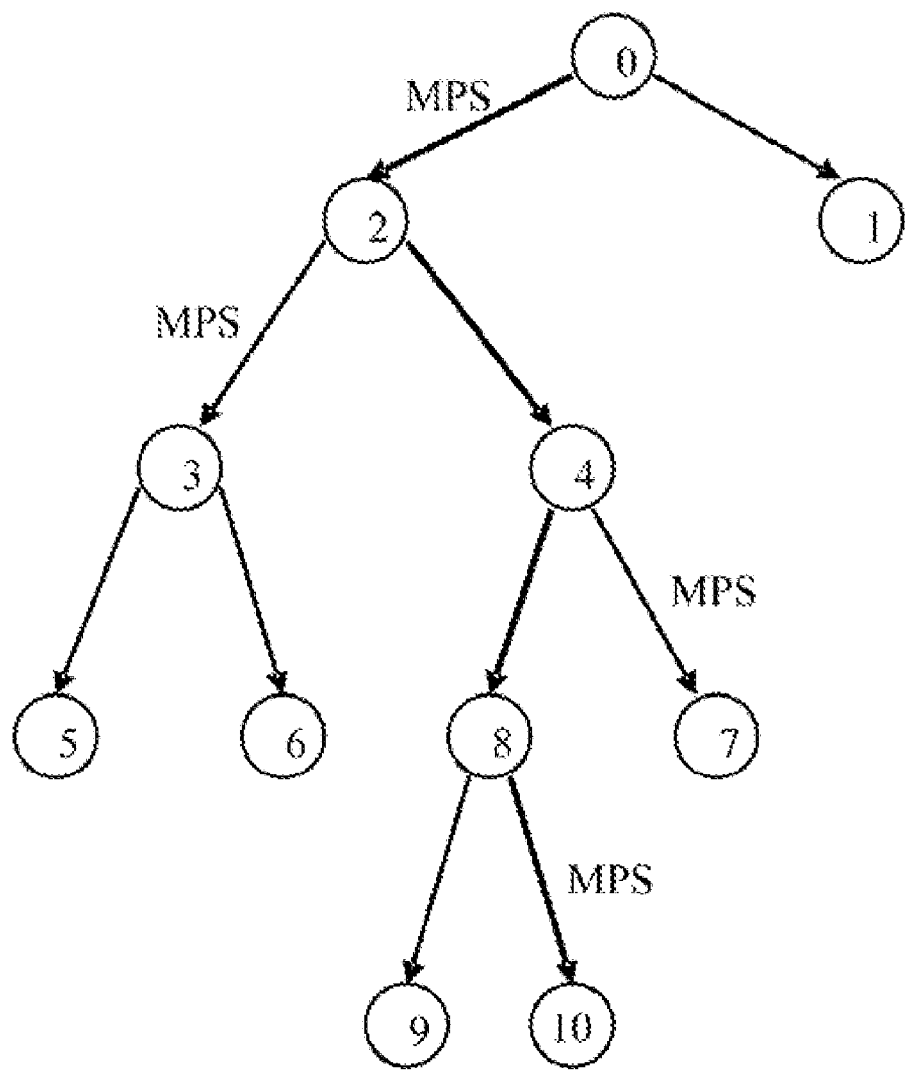
FIG. 3 is one exemplary embodiment of a traversing of a decoding tree as disclosed.

One exemplary embodiment of a traversing of a decoding tree is shown as FIG. 3. As shown, F is short for the fetching section 10, E is short for the executing section 20, and O is short for the output section 30.

The table look-up module 12 selects a decoding tree, as shown in FIG. 3. Here, the current node is 0, the MPS=0.

Figure 4:
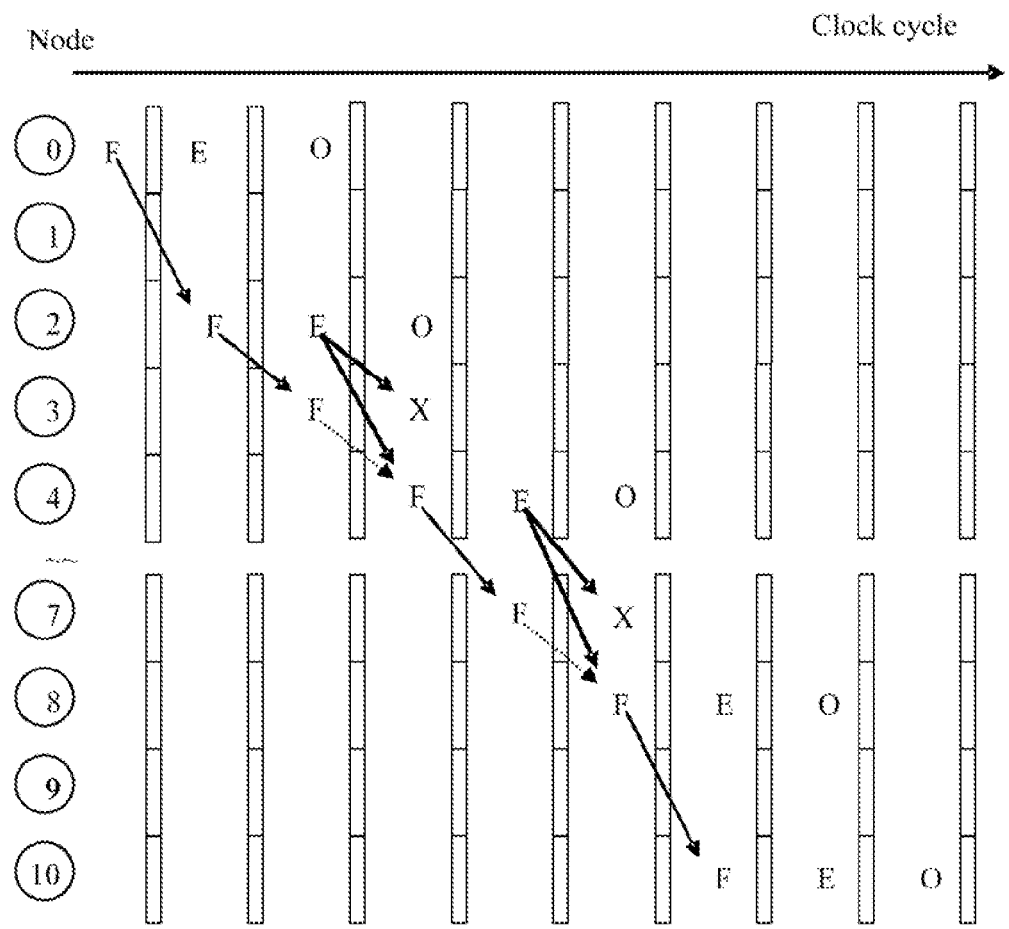
FIG. 4 is one exemplary embodiment of a predication of a next node as disclosed.

As shown in FIG. 4, when the prediction hits, for example, the current node is 0, it goes to read the next node 2.

When the prediction misses, for example, the current node may be 2, it will discard the next node 3, read node 4, and update the MPS.

The entropy decoding device 100 speeds up the process, by prediction via MPS. The MPS may be updated according to the decoded content, which increases the accuracy of the prediction, and indeed speeds up the entropy decoding device 100.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. An entropy decoding device, comprising:
   a storage module, to store an encoded bit stream;
   a table look-up module, to select a context probability model for the encoded bit stream, wherein the context probability model comprises all nodes on a decoding tree and a most probable symbol corresponding to each of the nodes;
   a prediction module, to predict presumptive information of a next node according to a current node and the most probable symbol of the current node;
   an arithmetic decoder module, to decode the encoded bit stream according to the current node, and output a decoded content, wherein the decoded content comprises real information of the next node;
   an update module, to determine whether the presumptive information of the next node conforms to the real information of the next node, and generate a flush instruction to the table look-up module and update the most probable symbol according to the flush instruction when the presumptive information of the next node does not conform to the real information of the next node; and
   an output module, to output the decoded content.

2. The entropy decoding device as claimed in claim 1, further comprising a state buffer, to read the current node and the most probable symbol from the table look-up module, and output the current node and the most probable symbol to the prediction module and the arithmetic decoder module.

3. The entropy decoding device as claimed in claim 2, wherein the state buffer is further to flush the current node, and read the next node according to the real information of the next node in the decoded content after the table look-up module receives the flush instruction.

4. The entropy decoding device as claimed in claim 1, further comprising a timing module, to generate a clock cycles during which the arithmetic decoder module and the prediction module operate synchronously.

5. The entropy decoding device as claimed in claim 1, further comprising a parsing module, to determine the current node as a leaf node or a branch node.

6. The entropy decoding device as claimed in claim 5, wherein the parsing module is further operable to output the decoded content to the output module when the current node is the leaf node.

7. The entropy decoding device as claimed in claim 5, wherein the parsing module is further operable to output the decoded content to the update module when the current node is the branch node.

8. The entropy decoding device as claimed in claim 1, wherein the table look-up module further comprises a context table, to store the context probability model.

9. The entropy decoding device as claimed in claim 1, wherein a means for updating the most probable symbol comprises maintaining the context probability model according to a probability state conversion means in H.264/AVC standard.

* * * * *